United States Patent [19]

Joshi

[11] 4,069,498
[45] Jan. 17, 1978

[54] STUDDED HEAT EXCHANGER FOR INTEGRATED CIRCUIT PACKAGE

[75] Inventor: Kailash Chandra Joshi, Endwell, N.Y.

[73] Assignee: International Business Machines Corporation, Armonk, N.Y.

[21] Appl. No.: 738,783

[22] Filed: Nov. 3, 1976

[51] Int. Cl.² .................. H01L 23/02; H01L 39/02
[52] U.S. Cl. ..................................... 357/81; 357/80; 174/16 HS; 165/80
[58] Field of Search .................. 357/74, 75, 79, 80, 357/81; 174/16 HS; 165/80, 105

[56] References Cited

U.S. PATENT DOCUMENTS

| 2,776,920 | 1/1957 | Dunlap | 357/74 |
| 3,896,544 | 7/1975 | Fosnough | 357/79 |

FOREIGN PATENT DOCUMENTS

| 2,536,624 | 3/1976 | Germany | 357/80 |
| 1,319,573 | 6/1973 | United Kingdom | 357/79 |
| 1,352,656 | 5/1974 | United Kingdom | 357/79 |

OTHER PUBLICATIONS

Microcircuit Heat Sink; by Suden; IBM Technical Disclosure Bulletin, vol. 8, No. 10, Mar. 1966, p. 1457.
High-Power Multi-Chip Packaging by Lee, IBM Technical Disclosure Bulletin, vol. 13, No. 12, May 1971, p. 3721.
Chip Cooling, by Campo., IBM Technical Disclosure Bulletin, vol. 17, No. 2, July 1974, p. 392.
Semiconductor Module with Improved Air Cooling; by Cain, IBM Technical Bulletin, vol. 19, No. 5, Oct. 1976, p. 1802.

Primary Examiner—Andrew J. James
Attorney, Agent, or Firm—Cyril A. Krenzer

[57] ABSTRACT

Heat is removed from the silicon devices in an integrated circuit package by means of a stud which is slidably mounted in a cap enclosing the integrated circuit device. A low melt solder is used to join the stud to the cap and the same solder is also deposited on the stud tip, which will subsequently contact the integrated circuit device in the package. After the integrated circuit, substrate and cap are assembled and sealed, the assembly is heated to melt the low melt solder so that the stud slides down and makes contact with the integrated circuit device. A controlled pressure can be applied to the stud if sliding does not occur. Thereafter, the assembly is allowed to cool. Upon cooling, a submicron gap exists between the solder on the tip of the stud and the device providing electrical isolation, but not significantly degrading the thermal path between the device and the ambient atmosphere.

11 Claims, 6 Drawing Figures

STUDDED HEAT EXCHANGER FOR INTEGRATED CIRCUIT PACKAGE

BACKGROUND OF THE INVENTION

1. Field of the Invention

This invention relates generally to heat transfer mechanisms, and more particularly to a heat transfer mechanism for removing the heat generated in an encapsulated circuit package assembly.

2. Prior Art

The efficient extraction of heat from integrated circuit chip packages has presented a very significant limitation on the design capability of integrated circuits. Without an efficient heat transfer mechanism, the speed and power capabilities of the circuitry of an integrated circuit package are severely limited. Early semiconductor devices solved the problem by making one of the electrodes of the device both a thermal and electrical direct contact to the external world and thereby connecting the electrode to an efficient heat transfer device, such as a studded heat sink. This was especially convenient when the electrode could be maintained at ground potential, for example. Typical discrete semiconductor devices of these configurations are found in U.S. Pat. Nos. 3,719,862 and 3,836,825. This approach was also used in some of the early approaches to the removal of heat from integrated circuit packages. For example, in an article entitled "Conduction Cooled Heat Plate for Modular Circuit Package" in Volume 13, No. 2, of the July 1970 issue of the IBM Technical Disclosure Bulletin there is disclosed a cooling technique using a conduction cooled isothermal heat plate which is metallurgically connected via an appropriate slug to the various circuit chips in an integrated circuit package. With this approach as with the approach with the prior art discrete devices, the chip then became fixed at the potential of the heat plate, which quite often was at ground potential.

In situations where the stud is connected directly to the chip, various "Z" stresses occur during the natural heat cycle the devices experience. These repeated stresses cause fatigue in the various connections within the devices, which can lead to failures of the devices.

However, there are many instances when the integrated circuit chip cannot be maintained at ground potential or at the potential of a heat sink, which presents a significant problem, since most good heat transfer mechanisms are also good electrical conductors. Many of the present integrated circuit package designs find the integrated circuit with discrete bond points to a suitable substrate enclosed by a cap in a sealed atmosphere of an inert gas. In these packages, the only thermal paths are the convection through the inert gas to the encapsulating cap and conduction through the discrete bond points to the substrate. These often experience very significant thermal resistances, which severely limit the power dissipation of the package. These restrictions are much more serious for devices that are flip-chip joined to the substrate through a series of bumps or solder balls on the active side of the chips. Here the conduction areas provided by the bumps are quite small and usually inadequate for the higher power devices. While it is possible to enhance the heat transfer from a flip chip such as by a metallurgical joining of the backside to the cap, as discussed previously, this introduces a set of stresses to the device and a serious reliability problem. In addition, it defeats the electrical isolation at the interface. Furthermore, as device costs increase, it is desirable to be able to repair defective devices. This is difficult to do when there is a metallurgical joining of both sides of the device to the package substrate and housing.

The problem can be even more severe with multichip modules, especially if they are mounted on a silicon substrate. It is extremely difficult to provide a viable metallurgical bond between a large silicon substrate and a heat sink without cracking the substrate and as a practical matter may be economically impossible.

OBJECTS AND SUMMARY OF THE INVENTION

Accordingly, it is a principal object of the present invention to provide a heat transfer mechanism for an integrated circuit package which overcomes the foregoing disadvantages of the prior art.

A more specific object of the present invention is to provide a heat transfer mechanism for an integrated circuit package which presents a low thermal resistance, while still maintaining a high electrical resistance to the integrated circuit device.

Still another specific object of the present invention is to provide a heat transfer mechanism for an integrated circuit package which overcomes the heat transfer gate provided by the bumps in a flip-chip device.

Yet another object of the present invention is to provide a heat transfer mechanism for an integrated circuit package which permits a production control over a heat transfer mechanism.

An additional object of the present invention is to provide a heat transfer mechanism for an integrated circuit package which does not adversely affect the reworkability of the package.

Still another object of the present invention is to provide a heat transfer mechanism for an integrated circuit package which is both economical and reliable.

A still further object of the present invention is to provide a heat transfer mechanism for an integrated circuit package which minimizes the stresses placed on the integrated circuit device.

The foregoing and other objects are accomplished according to one aspect of the invention wherein an integrated circuit device is suitably mounted to a substrate which is circuitized and pinned to provide connections to the appropriate external environment. The integrated circuit device is suitably sealed by a cap attached to the substrate and surrounding the integrated circuit device. The cap includes a slidably mounted stud of a suitable alloy having good thermal transfer characteristics, and a compatible thermal expansion coefficient with the stud being supported in the cap by a low melt solder. The same solder is deposited on the end of the stud in the form of a ball. After the integrated circuit chip is attached to the substrate and the cap is assembled and sealed, the device is heated to melt the low melt solder and the stud is allowed to slide down onto the top of the chip. However if the stud weight is not adequate to establish contact with the chip, a controlled pressure is applied to the stud. After the assembly is allowed to cool, a submicron gap exists between the teardrop at the end of the stud and the integrated circuit chip, providing the desired electrical isolation of the stud from the chip, yet providing a good heat transfer path.

According to another aspect of the invention, the surface of the circuit device adjacent the tip of the stud could include a nonconductive, extremely thin layer, such as silicon dioxide, to provide the necessary electrical isolation.

DESCRIPTION OF THE PREFERRED EMBODIMENTS

Figure 1:
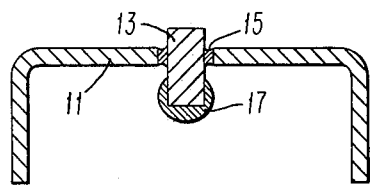
FIG. 1 is a sectional view of a cap and stud for an integrated circuit package according to the present invention.
Figure 2:
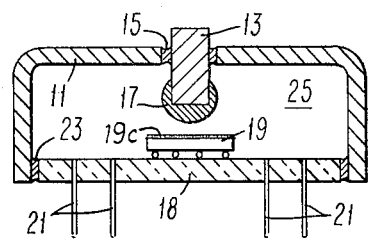
FIG. 2 is a sectional view of an integrated circuit package according to the present invention prior to the contacting of the stud and the chip.

Referring now to FIG. 1, there is shown a cap/stud insert assembly according to the present invention which includes a heat conductive cap 11 with a conductive stud 13 inserted in a slot in the top of the cap 11. A low melt solder joint 15 is provided around the opening in the cap top 11 proximate the stud 13, and a low melt teardrop solder 17 is located on the inward end of the stud 13. As seen in FIG. 2, the cap assembly 11 is adapted to be mounted on a pinned substrate 18, which may be suitably circuitized to provide connections from an internally mounted chip 19 to an appropriate board assembly via pins 21. A seal 23 is provided between the ends of the substrates 18 and the cap 11. The seal 23 may be a hermetic seal and there may be a low pressure or inert gas in the enclosure 25 surrounding the chip 19. At this point in the assembly, the stud 13 with its teardrop solder 17 is positioned a suitable distance from the top of the chip 19.

Figure 3:
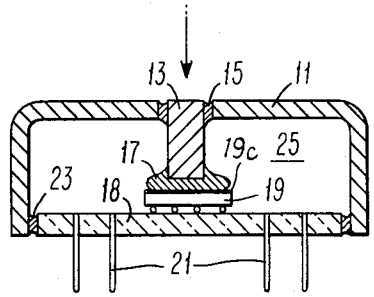
FIG. 3 is a sectional view of a completed integrated circuit package according to the present invention.

The next step of the assembly is to place the device in a heat environment adequate to melt the low melt solder 15, 17 and, if necessary, to provide a controlled pressure on the stud 13 to bring it into direct contact with the chip 19, as seen in FIG. 3.

Figure 4:
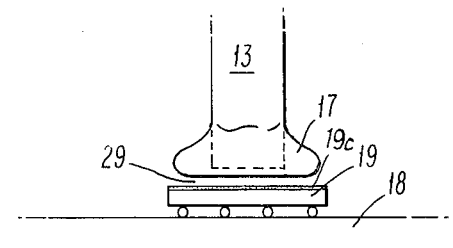
FIG. 4 is a partial sectional view of a completed integrated circuit package according to the present invention.

Next, the device is cooled to the ambient temperature. Referring to FIG. 4, as the device cools, the solder tip 17 retracts a small distance from the top of the chip 19 providing therebetween a submicron gap 29 which is created due to the contraction of the solder and non-wet condition that exists at the interface of the solder 17 and the chip surface 19.

Since the cap 11 and the stud 13 can be made out of the same metal/alloy, any thermal cycling will lead to only a fractional change in the gap 29 between the solder ball 17 and the chip 19. Furthermore, the gap 29 prevents any "Z" stresses from being transferred to the chip from the stud during heat cycling. If desired, to assure the electrical isolation between the ball 17 and the chip 19, a silicon dioxide layer, an epoxy coating or a seal can be placed on the top of the chip 19. The insulating layer is shown as layer 19c in FIGS. 2, 3 and 4.

Figure 5:
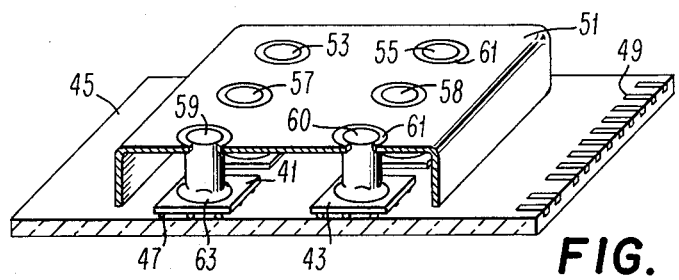
FIG. 5 is a perspective view partially in section of an alternate embodiment of a multichip integrated circuit package according to the present invention.
Figure 6:
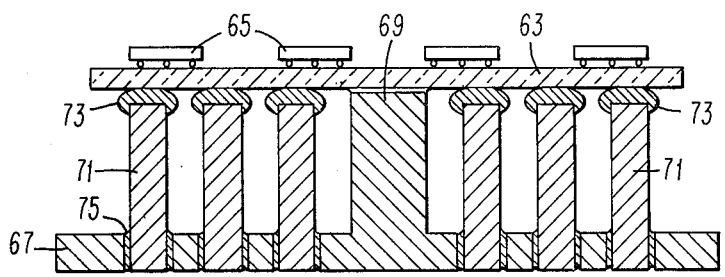
FIG. 6 is a sectional view of an alternate embodiment of an integrated circuit package with a large carrier for a multiplicity of chips according to the present invention.

The concept of the present invention can also be extended to multichip modules, as illustrated in FIGS. 5 and 6. In FIG. 5, a plurality of chips 41, 43 are connected to a substrate 45 via flip-chip bumps 47 and appropriate circuitization (not shown) on the surface of substrate 45 provides the desired connections between the chips 41, 43 and the edge connection points 49. The cap 51 has inserted therein a plurality of studs 53, 55, 57, 58, 59 and 60, which studs are slidably mounted so that when the solder 61 surrounding the respective studs is heated to its melting point, the studs can be brought into direct contact with their respective chips in much the same manner as illustrated in FIGS. 2 through 4. Again, upon cooling a submicron gap will exist between the solder balls 63 on the ends of the studs and the surface of the chips 41, 43. As is readily apparent, this multichip package configuration will have the same degree of dimensional stability as the previously illustrated devices and will also have improved reworkability, since the cap 51 and the studs 53, 55, 57, 58, 59 and 60 can be removed from the rest of the package without placing any severe stresses on the rest of the package.

A further application of the concept of the present invention is illustrated in FIG. 6. Here, a substrate 63, such as made of silicon, will include a plurality of integrated circuit chips 65, which are flip-chip mounted on the substrate. The total number of such chips mounted on the substrate can be in the tens or even hundreds. With a large silicon substrate such as this, it is impossible to provide a total metallurgical bond to the substrate without damaging it. Accordingly, a metal heat exchanger 67 is bonded to the underside of the substrate 63 by means of a post 69, the bond being of relatively small dimension, so as not to cause craking, etc. Thereafter, a plurality of studs 71 with solder balls 73 at the end thereof, which studs are contained in openings 75 of the heat exchanger 67 are brought into contact with the underside of the carrier 63 by heating the devices to melt the low melt solder permitting the solder balls 73 on the ends of the studs 71 to brought into intimate contact with the underside of the carrier 63. The heat from the heat exchanger 67 can be removed through various means including a circulating liquid, such as water.

It is to be understood that the invention is also applicable to any situation where heat is to be removed from any large silicon substrate where it is not technically feasible to provide a large area, direct metallurgical bond. For example, where silicon sheet material is used as an energy converter in a solar cell, the concept of the present invention, for example as shown in FIG. 6, could be used to remove the heat from the silicon sheet.

Therefore, it is readily apparent that the present invention provides a heat transfer mechanism for integrated circuit packages which significantly improves the thermal transfer characteristics of the package without adversely affecting the reworkability of the package and in a manner which is both economical of design and production.

It will be readily apparent to those skilled in the art that various other modifications and changes may be made within the spirit and teaching of the present invention. For example, the studs and cap materials may be made of metal such as copper, aluminum, nickel, or brass. The low melt solders used can consist of indium, bismuth, tin, lead or antimony, for example. Still other changes and variations will be apparent to those skilled in the art without departing from the spirit or scope of the invention. Therefore, while the invention has been particularly shown and described with reference to

I claim:

1. In and integrated circuit assembly including at least one integrated circuit device suitably mounted on a circuitized substrate with a cap covering the device on the substrate, the improvement comprising:
    an opening in said cap, said opening being positioned in said cap to be above said device when said cap covers said device;
    a stud member having a high heat transfer coefficient adapted to be mounted in said opening proximate said device; and
    low melt solder in the periphery of said opening surrounding said stud and low melt solder on the tip of said stud proximate said device, whereby upon the application of heat to said assembly, said low melt solder melts and said stud is brought into an intimate heat transfer relationship with said device, and upon cooling the low melt solder solidifies to maintain an air tight enclosure with said cap over said substrate and electrical isolation between the solder on the tip of said stud and said device is established.

2. The invention according to claim 1 wherein the top of said device is non-wetted and whereby upon cooling the low melt solder on the tip of said stud contracts leaving a submicron gap between said device and the solder on the tip of said stud.

3. The invention according to claim 1 wherein the top of said device proximate said stud includes a thin, nonconductive material layer.

4. The invention according to claim 3 wherein said thin, nonconductive material layer is silicon dioxide.

5. The invention according to claim 1 wherein said integrated circuit assembly includes a plurality of integrated circuit devices, a like plurality of openings in said cap, each disposed above a respective one of said devices and a further like plurality of studs, each positioned in a respective one of said openings.

6. The invention according to claim 1 wherein said stud is made of one or more materials selected from the group of copper, aluminum, nickel and brass.

7. The invention according to claim 1 wherein said low melt solder is made of one or more materials selected from the group of indium, bismuth, tin, lead and antimony.

8. The invention according to claim 1 wherein upon the melting of said low melt solder, the force of gravity brings said stud into an intimate heat transfer relationship with said device.

9. The invention according to claim 1 wherein upon the melting of said low melt solder, a controlled pressure is applied to said stud to bring said stud into an intimate heat transfer relationship with said device.

10. In an integrated circuit assembly including a plurality of integrated circuit devices suitably mounted on the top side of a circuitized silicon substrate, a heat transfer mechanism adapted to remove heat from said silicon substrate, comprising:
    a heat sink of thermally conductive material including at least one bonding post connecting said heat sink to the bottom side of said substrate;
    a plurality of openings in said heat sink;
    a like plurality of studs having high heat transfer coefficients, each adapted to be mounted in a respective opening in said heat sink; and
    low melt solder in the periphery of each of said openings and low melt solder on the tip of each of said studs proximate said silicon substrate, whereby upon the application of heat to said assembly, said low melt solder melts and each of said studs is brought into an intimate heat transfer relationship with said substrate and upon cooling electrical isolation between the solder on the tip of said stud and said device is established.

11. In an encapsulated assembly including a large silicon substrate which is adapted to generate heat, a heat transfer mechanism adapted to remove heat from said silicon substrate, comprising:
    a heat sink of thermally conductive material including at least one bonding post connecting said heat sink to the bottom side of said substrate;
    a plurality of openings in said heat sink;
    a like plurality of studs having high heat transfer coefficients, each adapted to be mounted in a respective opening in said heat sink; and
    low melt solder in the periphery of each of said openings and low melt solder on the tip of each of said studs proximate said silicon substrate, whereby upon the application of heat to said assembly, said low melt solder melts and each of said studs is brought into an intimate heat transfer relationship with said substrate and upon cooling electrical isolation between the solder on the tip of said stud and said device is established.

* * * * *